(12) United States Patent
Berg

(10) Patent No.: US 6,746,946 B2
(45) Date of Patent: Jun. 8, 2004

(54) PROCESS AND APPARATUS FOR MANUFACTURING PRINTED CIRCUIT BOARDS

(76) Inventor: N. Edward Berg, 70 Horizon Dr., Bedford, NH (US) 03110

( * ) Notice: Subject to any disclaimer, the term of this patent is extended or adjusted under 35 U.S.C. 154(b) by 0 days.

(21) Appl. No.: 10/100,927

(22) Filed: Mar. 19, 2002

(65) Prior Publication Data

US 2003/0181038 A1 Sep. 25, 2003

(51) Int. Cl.[7] .............................................. H01L 21/44
(52) U.S. Cl. ....................................................... 438/599
(58) Field of Search ........................ 438/599, 151–152, 438/586

(56) References Cited

U.S. PATENT DOCUMENTS

| | | | |
|---|---|---|---|
| 4,661,431 A | 4/1987 | Bujese et al. ................ 430/126 |
| 4,763,157 A | 8/1988 | Bujese ...................... 355/3 TR |
| 5,382,315 A * | 1/1995 | Kumar ......................... 216/39 |
| 5,470,644 A | 11/1995 | Durant ........................ 428/209 |
| 5,489,985 A | 2/1996 | Mochida et al. ............. 356/398 |
| 6,080,606 A * | 6/2000 | Gleskova et al. ........... 438/151 |
| 2002/0028574 A1 * | 3/2002 | Murata et al. |
| 2002/0154187 A1 * | 10/2002 | Wong et al. |

OTHER PUBLICATIONS

Advanced Process Control Framework Initiative (APCFI) Project Tech Transfer #99053735A–TR International Sematech. Jun. 30, 1999. <<www.semateac.org/public/docubase/document/3735atr.pdf>>.

* cited by examiner

*Primary Examiner*—Craig A. Thompson
(74) *Attorney, Agent, or Firm*—Hayes Soloway P.C.

(57) ABSTRACT

A method and apparatus for producing printed circuits utilizing direct printing methods to apply a pattern mask to a substrate. The pattern mask may be an etch resist mask for forming conductive pathways by an etching process, or the pattern mask may be a plating mask with conductive pathways being formed by a plating operation. The process of the present invention is applicable to forming both single-sided and double sided printed circuit boards.

22 Claims, 7 Drawing Sheets

PROCESS AND APPARATUS FOR MANUFACTURING PRINTED CIRCUIT BOARDS

FIELD OF THE INVENTION

The present invention relates to a process and apparatus for forming single-sided, double-sided, or multi-layer circuit boards.

BACKGROUND OF THE INVENTION

The manufacture of printed circuit boards generally follows either subtractive or additive processing techniques. According to a general subtractive process for the manufacture of printed circuit boards, a conductive layer laminated to a non-conductive substrate is selectively removed to leave a desired pattern of conductive pathways. The pattern of conductive pathways is typically formed by providing the conductive layer with a resist film, for example containing photosensitive organic monomers. Upon exposure to ultraviolet light, the photosensitive organic monomers polymerize, forming hardened regions. Two types of resists are in common usage today: dry film resists, containing a thin film of photosensitive monomers covered by a ultraviolet-transparent protective film, and liquid resists, also containing photosensitive organic monomers, often present in a solution allowing application as a liquid.

Once the resist has been applied to the conductive layer, the resist is photo-imaged, i.e., selectively exposed to an appropriate ultraviolet light source. An imaging mask is interposed between the source of ultraviolet light and the circuit board containing the resist. The imaging mask includes an ultraviolet-opaque member having an ultraviolet-transparent pattern therein. Accordingly, when the circuit board is photo-imaged only those regions corresponding to the ultraviolet-transparent pattern will be exposed and polymerized.

Subsequent to imaging, the unexposed, and therefore un-polymerized regions of the resist are removed, as through the use of appropriate solvents. The regions of the conductive layer not protected by the polymerized resist are then removed using an acid or alkaline solution. Once the resist has been removed, the non-conductive substrate is left containing the conductive layer in the pattern corresponding to ultraviolet-transparent pattern of the imaging mask.

Additive processes for the manufacture of printed circuit boards typically begin with a non-conductive substrate upon which conductive pathways are selectively added. Consistent with a conventional additive process, a non-conductive substrate containing a resist layer, such as those employed during subtractive methods. The substrate bearing the resist layer is imaged with a negative photo-resist, wherein only those regions corresponding to the desired pattern of conductive pathways remains unexposed. Accordingly, when the resist is developed, i.e., the un-polymerized resist is removed, the non-conductive substrate is exposed in the regions corresponding to the desired conductive pathways. Plating the exposed portions of the non-conductive substrate with a conductive material, and then removing the polymerized regions of the resist completes the process.

SUMMARY OF THE INVENTION

A process for the manufacture of either single sided or double sided printed circuit boards according to a general scheme wherein, a substrate including a conductor may sequentially be pre-treated, through holes drilled and made conductive, e.g., for later assembly in a multi-layer circuit board, and then have a first etch resist mask or pattern mask applied to a first side of the substrate. The first etch resist mask may thereafter be set. A second etch resist pattern mask may then be applied to a second side of the substrate, and also set. The substrate having an etch resist mask applied to respective surfaces of the substrate may then be etched to remove any exposed portions of the conductor. Following etching, the etch resist pattern masks may then be removed from the substrate, leaving conductive traces corresponding to portions of the conductor covered by the etch resist mask during the etching process.

The process consistent with the present invention may advantageously be employed for the manufacture of multi-layer laminated circuits. Accordingly, a plurality of individual printed circuit boards manufactured by the process herein may be laminated into a composite structure, wherein the individual printed circuits are generally isolated one from another by interleaved insulating layers.

The present invention also relates to a method of forming a printed circuit wherein a substrate including a thin "background" conductor may sequentially be pre-treated, have through holes drilled and made conductive, and then have a plating resist mask applied to both sides of the substrate, with each of the plating resist masks being set on the substrate following application thereof. After plating resist mask has been applied to the substrate, the substrate may be plated, wherein regions of the substrate not covered by plating resist masks are plated. Subsequent to plating, the plating resist mask is removed from the substrate, and the thin "background" conductor may be etched away. By this process, only those regions that were previously plated, i.e., those regions not covered by the plating resist mask, remain conductive as a result of the built up thickness of these regions.

The present invention also pertains to an apparatus for printing a pattern mask or a conductor onto a substrate. According to a first embodiment, the apparatus comprises a support roller disposed adjacent to print head of a printer used to apply the pattern mask. A substrate may be flexed over the support roller, whereby the substrate achieves a convex geometry relative to the print head. According to this embodiment, a portion of the substrate to which the pattern mask or conductor is instantly being applied may be maintained at a constant distance to the print head.

According to another embodiment, the apparatus consistent with the present invention comprises a compliant member disposed on a rigid member. The compliant member may be disposed adjacent to a print head of a printer used to apply a pattern mask/conductor to a substrate. The compliant member is preferably spaced from the print head a distance to accommodate a substrate therebetween. The apparatus further comprises a mechanism for retaining a substrate to the compliant member, whereby the substrate may be allowed to move relative to the print head in a direction that is orthogonal to a plane tangent to the print head at the point of printing.

Furthermore, the present invention relates to a method of printing a pattern mask or conductors to a substrate, such as an etch resist mask applied to a conductive layer on a substrate or a plating mask applied to a surface of substrate. The method consistent with the present invention includes printing a first pattern mask to the substrate, or a conductive layer disposed thereon. Subsequent to printing the first pattern mask, the position and/or orientation of the first pattern mask is detected. Alternatively, the substrate may be held in a fixed orientation on a substrate feed system, whereby the position and orientation of the first pattern mask is prevented from shifting from a known position. The position an orientation of the first pattern mask may be know by the fixed orientation of the substrate, or may be detected using such techniques as optical scanning or laser scanning the surface of the substrate in order to determine the precise placement and orientation of the first pattern mask. Based on the detected position and/or orientation of the first pattern mask, a second pattern mask or conductor is printed onto the substrate. The second pattern mask may be printed in register with the first pattern mask, or in complimentary manner relative to the first pattern mask. Consistent with this method, the second pattern mask may be precisely positioned on the substrate in order to accommodate any positional and/or orientation errors that may have occurred during the printing of the first pattern mask.

BRIEF DESCRIPTION OF THE DRAWINGS

The present invention is described herein with reference to particular exemplary embodiments as shown in the following drawings, wherein:

FIG. 3b is an alternative embodiment of the substrate feed system illustrated in FIGS. 2 and 3a;

DETAILED DESCRIPTION OF THE INVENTION

The method of manufacturing printed circuits consistent with the present invention may be carried out on most conventionally known printed circuit substrates of a general structure including a non-conductive member having a top surface and a bottom surface. While the process consistent with the present invention is susceptible for use to form a single sided circuit board having a conductive layer, or foil, disposed on one side, consistent with the exemplary example respectively disposed on the top surface and the bottom surface are a first conductive layer, or foil, and a second conductive layer, or foil. The non-conductive member may include a fiber-reinforced thermoset composition, a molded thermoplastic material, a ceramic material, a glass material, a stiff cardboard material, epoxy glass, mixtures and mixtures of the same. Furthermore, the substrate may be provided as either a rigid member or a flexible member. The degree of flexibility of the substrate is generally dictated by the non-conductive member. An exemplary rigid substrate may include an FR-4 type epoxy material. The non-conductive member may be provided having a thickness in the range of between about 0.0001 and 0.124 inches, and preferably between about 0.001 and 0.062 inches in thickness.

The first and second conductive layers, or foils, may be metallic films having a thickness between about 0.0002 and 0.010 inches. The first and second conductive layers may be generally coextensive with the non-conductive substrate, or may optionally be sized to provide an exposed border of the non-conductive member around the perimeter of the conductive layers. Additionally, the first and the second conductive layers may include the same material, or may be formed from different materials. Preferably, both the first and the second conductive layers are formed from copper.

Figure 1:
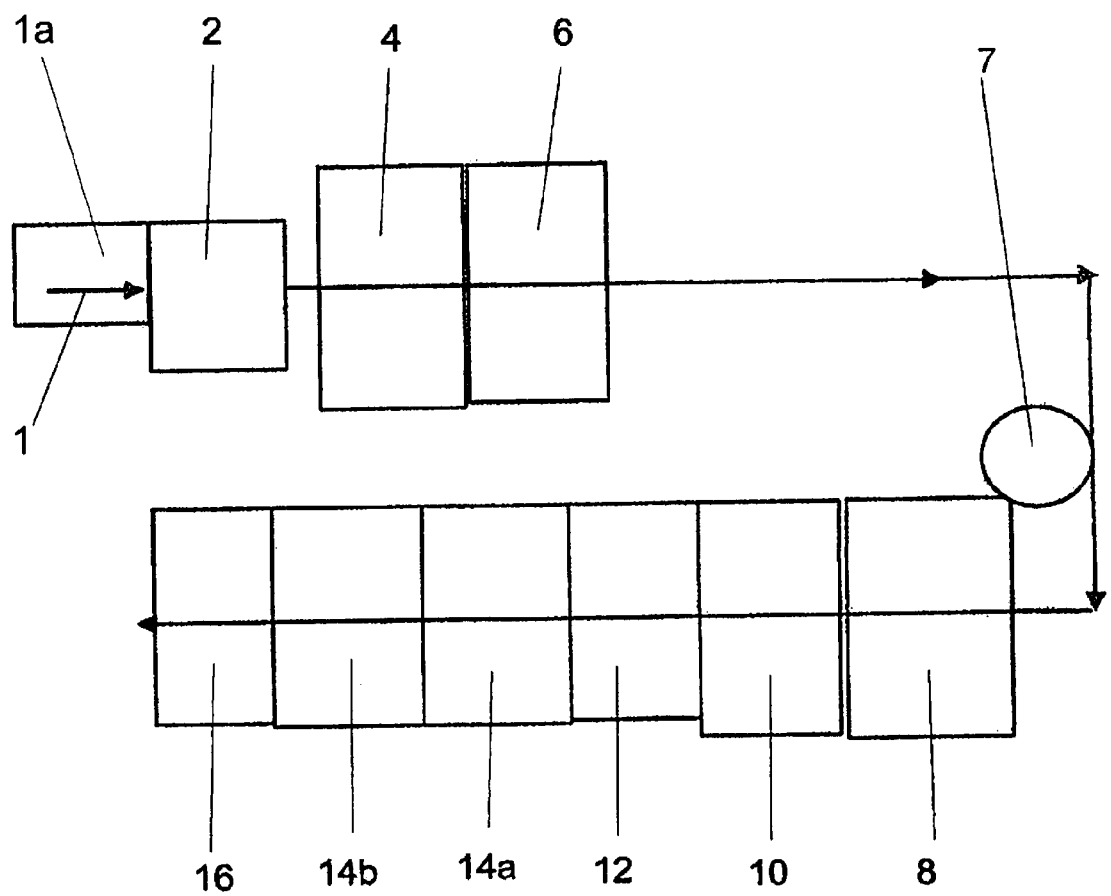
FIG. 1 is a schematic drawing of an exemplary manufacturing process consistent with the present invention.

Referring to FIG. 1, an exemplary embodiment of the process consistent with the present invention is schematically illustrated. According to the illustrated embodiment, the substrates 1 having top surfaces coated with conductive layers 1a are first pre-treated 2 to prepare the conductive layers for further processing. Next, at least one conductive layer receives an etch resist or plating pattern mask 4 by direct toner deposition, the mask thereafter being set or cured 6. Subsequently, a second conductive layer may be direct toner imaged 8, thereby forming an etch resist mask on the second conductive layer. The second etch resist mask may then be set or cured 10. Thereafter, the substrate may be etched 12 to remove any portions of the first and second conductive layer not covered by the respective first and second etch resistant mask. Once the substrate has been etched, the etch resist masks may be removed 14a and 14b, and the surface of the substrate may optionally be cleaned 16.

As illustrated in the schematic manufacturing process shown in FIG. 1, while not required, the process herein may advantageously be carried out as a continuous manufacturing process. A plurality of individual substrates may be continuously transported from one processing station to the next, with the various processes being carried out on the substrates while they are in continuous or start-stop motion. This aspect of the present invention may be achieved by carrying the substrates on a web, or conveyer. Accordingly, the individual substrates may be secured to the web by means such as pins, clips, edge gripping jaws, etc. Alternatively, the individual substrates may travel along a pair of parallel drive rails, chains, etc., wherein the substrates are secured about opposed edges. Still alternatively, the substrates may be conveyed through a manufacturing line by a series of robots that move the substrates from one processing station to another. In a further embodiment, in the case of a flexible substrate, the substrate itself may be a continuous web. In this instance the substrate may be fed, as from a roll, and guided through a manufacturing line by a series of driven and idle rollers, etc.

Still alternatively, a plurality of substrates may be linked together to form a "mini-web". The mini-web may be formed by joining the individual substrates, as by a flexible joint therebetween, or by retaining the substrates adjacent to one another along a track or transport mechanism. In this manner, several mini-webs may be individually masked, or imaged, and subsequently joined into a longer web for subsequent processing.

The pre-treatment step 2 of the exemplary process is undertaken to clean the first and the second conductive layers. The pre-treatment step not only cleans any oxide deposits or coatings from the conductive layers, but may optionally slightly roughen the surfaces of the conductive layers. The produced surface roughness provides a surface having enhanced mechanical bonding characteristics, for any coating that may be subsequently applied. The cleaning process preferably includes a scrubbing, or mild abrading process, and may additionally include the application of a surface treatment coating or wash.

The pre-treatment process may generally follow a conventional chemical machine polishing (CMP) process. Advantageously, a mild abrasive may be employed for the cleaning of the first and the second conductive layers. Advantageously, the pre-treatment process further involves the use of a mild polishing agent to reduce the scrubbing time required to achieve the desired level of cleaning while keeping the risk of removing too much of the conductive layers to a minimum. The polishing and cleaning agent is a mixture or composition obvious to those who are knowledgeable in the art, which not only serves as a polishing agent, but also provides the advantages of being easily cleaned/removed from the pre-treated boards and being, generally, environmentally friendly.

According to the next step in the exemplary process, a first pattern mask may be applied to portions of the first conductive layer 4, whereby other portions of the first conductive layer remain exposed. The first pattern mask may be applied corresponding to a desired conductive pathway, or plurality of conductive pathways that make up the printed circuit. Consistent with the present invention the first pattern mask may be applied to the first conductive layer using a direct toner imaging technique. Preferably, the pattern mask is an etch resist ink applied by ink jet printing or toner applied by laser printing. The pattern mask may also be applied to the first conductive layer by an ink jet printer or laser printer in off-set mode, using, for example, a belt or a drum to effect application of the etch resist ink or toner to the first conductive layer.

Alternatively, the pattern mask may be applied using various other printing techniques. Such additional printing techniques may include, for example, electrostatic printing, lithographic printing, intaglio printing, etc. Consistent with all of these processes, an ink or toner may be applied directly to the surface of the conductive layer. Furthermore, all of the exemplary printing techniques may be employed in either a direct printing or offset printing mode. In consideration of the applicability of numerous printing techniques that may be employed consistent with the present invention, any description as to one process should be considered equally applicable to the others.

In order to aid adhesion of the ink or toner to the conductive layer, and to prevent spread of the pattern, it may additionally be desirable to coat the conductive layer. Exemplary coatings may include, for example, a conventionally known etch resist film. Accordingly, the pattern mask may be printed directly to the coating. The exposed portions of the coating may be removed from the conductive layer prior to the etching process.

In addition to the pattern mask, identification, indexing, and/or timing markings may be applied to or printed onto the substrate. Such identification and/or timing markings may be directed for use in inventory control, quality control, reference indexing for additional printing, and assembly, etc. Obviously, it will be appreciated that any identification and/or timing markings will be applied to regions of the substrate that will not interfere with any circuit patterns being formed on the substrate. The identification and/or timing markings may be applied either to the topside or the bottom side of the substrate, for example using dual side printing. Additionally, it should be understood that while identification, timing and/or position markings may be applied in the same manner, and using the same materials/toner as the pattern mask, it is not necessary that such is the case.

Desirably, the first pattern mask, as well as any other markings may be printed using a generally conventional laser printer, as may be used for laser printing to paper. However, some modifications or alterations to the laser printer may be necessary to accommodate the process herein. For example, the image may have positional errors that must be compensated; therefore it is usually necessary to employ distortion correction software to compensate for fixed errors in the laser scanner.

All laser printers have distortions caused by irregularities in the scan direction of the polygon rotation because not all surfaces on the polygon are exactly equal. These irregularities cause variations in the line-to-line dot positions in the scan direction. For this reason, it is necessary to compensate each of the individual printers used in the process, after ascertaining the systemic, or repeating errors. Once the presence and magnitude of these errors have been determined, distortion correction software is applied to modify the printing process to eliminate these errors. With distortion correction it is possible to achieve pattern masks that are free from any systemic error. Use of the printer's start of scan sensor for corrections may be adequate for distortion corrections.

Distortion or error in the direction orthogonal to the laser scan may be a function of the feed of the substrate through the printer. Incorporating external servo systems to provide movement of the print media, i.e., the substrate, through the printer, may eliminate these errors. One aspect of this modification includes intercepting the printer's normal "go" signal, which initiates the printing operation. This print initiation may advantageously be controlled by the servo system that moves the substrate through the printer.

Even with the above-two modifications, errors or distortions may still be present in the printing operation. Accordingly, distortion correction software may be applied to the printing operation to eliminate any lingering errors. Generally this may involve calibrating individual printers to ascertain the presence and degree of any systemic error. All such known and repeating error may easily be removed or compensated for using distortion correction software.

In addition to the modifications pertaining to inherent distortions in the printing operation, the printers must be modified to accommodate printing to the printed circuit substrates. Such modifications involve bypassing error signals resulting from removed paper trays, open covers, etc. Additionally, the printer may have to be physically modified to accommodate feed mechanisms other than the normal, i.e., original equipment, pinch roll feed mechanisms.

Light incident on the junction of the printing drum or belt and the printed surface tends to cause the toner to defocus, therein creating a blurred or light (low density) image. For this reason, it is desirable to modify the printer to reduce or eliminate access of ambient light to the printed surface. Appropriate modifications may simply include the use of light shields, i.e., opaque shields from the region just upstream of the print head, downstream to the cure station.

Several different commercially available toners are suitable for use with the present invention. A first exemplary toner is available from Hewlett Packard, which is a two-component toner. A second exemplary commercial toner, suitable for producing etch resist or plating resist or plating pattern masks, is available from Lexmark. The toner available from Lexmark is of a mono-component variety. Of these two exemplary manufactures of toner, it has been found that the two-component variety of toner provides better results for both etch resist masks and plating masks. Cartridge re-fillers constitute another source for both general types of toner, i.e., two component and mono component.

Producers of other laser printers are also potential suppliers of toner. Generally the toner employed to form the pattern mask is of the dry toner variety. However, in the case of inkjet printing, liquid inks may be employed.

Also, it may be necessary to modify the printer's fuser. Printing on metal, i.e., the conductive layer, is difficult because the surface is not porous and the metal of the conductive layer conducts and radiates heat away. These characteristics may result in the spreading of the toner on the surface of the conductive layer, therein distorting the pattern mask. Providing a clean metallic surface that has been at least-slightly roughened by chemical means and/or mechanical and surface treated, as described above with respect to the pretreatment process 2, should enhance the ability of the conductive layer to receive the toner image, i.e., the pattern mask.

Additionally, it has been found that the ability of the conductive layer to receive the toner image may be improved by providing an electrical voltage to the conductive layer of the substrate. This electrical voltage aids in the transfer of the toner from the print drum 24, or off-set roll or belt, to the conductive layer and helps to prevent the spread of the pattern image once it has been received on the conductive layer. The voltage is coupled to the print drum 24 and the conductive layer to which the pattern mask is being applied by respective leads. The voltage required to realize the benefits of this aspect of the present invention are largely determined by the conductive properties of the toner and any separation, or gap that may exist between the conductive layer and the print drum 24. Exemplary voltages may range in magnitude from between about 50–300 volts. In addition to being coupled to an appropriate voltage, modifications may have to be made to the printer to prevent interference with the printing operation by the applied voltage.

In addition to the above modifications to the printer, it may be necessary to mechanically modify the laser printer to allow substrates having the desired range of thickness to pass through, and be printed by, the laser printer, and to maintain the desired separation between the print head of the printer and the surface of the substrate. In some cases, it may be preferred that the print head actually contact the substrate, but with only a small amount of force being applied therebetween. In other cases, a greater separation between the print head and the substrate may be desirable. In either situation, it may be damaging for a large force to be applied to the print head by the substrate.

It should be noted that, as used herein, print head is meant to generically refer to both the print head of an inkjet printer, the print drum of a laser printer, as well as other printing mechanisms as may be applicable. Similarly, description given with reference to a laser print drum is equally applicable to an inkjet printer print head. Any instances wherein the terms and/or structures are not interchangeable will be readily apparent to those having skill in the art.

When printing to thinner substrates, a conventional laser printer may often be used in a relatively unmodified condition. That is, conventionally known nip roll feed mechanisms may be suitable for imaging relatively thin and flexible substrates. It may be possible to use a conventional nip roll feed mechanism for relatively flexible substrates makes forces that may be applied to the print head by the substrate more easily controllable.

With regard to the direct toner imaging of thicker substrates, it may be necessary to modify the laser printer to a greater degree than simply providing for the feeding of thicker substrates. Substrates having a thickness greater than about 0.020 inches are often relatively rigid, and are also generally totally not flat. By not flat it is meant that the substrate may exhibit some degree of warpage or departure from lying in a mathematical plane. While this condition may be very minor, perhaps not even perceptible to the naked eye, the lack of flatness may result in damage to the laser printer and/or poor print quality. Therefore, the laser printer must be modified to accommodate any lack of flatness in the substrate in order to maintain a constant distance between the print head and the substrate. For these same reasons, the conductive layer on the substrate must not have any burrs, which may cause damage to the print head.

Figure 2:
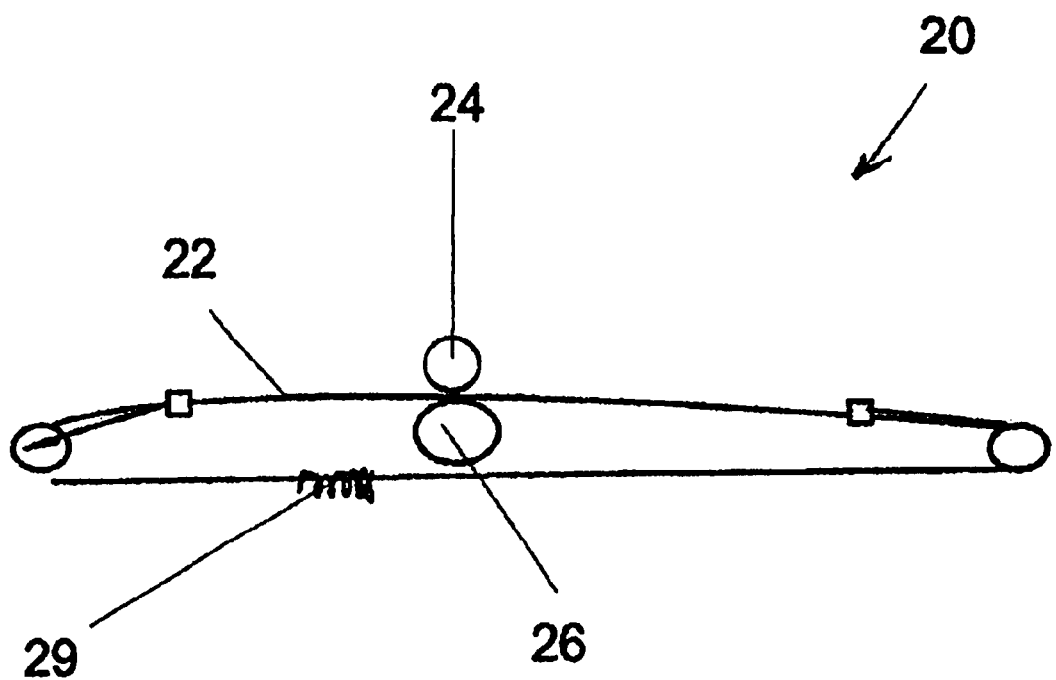
FIG. 2. illustrates a first exemplary substrate feed system consistent with the present invention.

Referring to the side view in FIG. 2, a first system for accommodating any lack of planarity in the substrate is generally illustrated at 20. Consistent with the system 20 illustrated in FIG. 2, a substrate carried by the transport mechanism 22 is imaged by a print drum 24. During the direct toner deposition, the substrate may be supported on the opposite side of the substrate 28 from the print drum 24 by a support roller 26. As shown in detail in FIG. 3a (note the relative dimension have been exaggerated for clarity), as the substrate 28 passes by, and is imaged by the print drum 24 the substrate 28 is forced into an arcuate configuration, with the curvature being in the direction of feed. As illustrated, the substrate is caused to bear against the support roller 26, presenting a convex surface relative to the printing roller 24. In this manner, the substrate 28 is caused to pass by the print drum 24 at a constant distance, within the tolerance of thickness of the substrate 28, from the print drum 24. While the amount of curvature induced on the substrate 28 is within the range of elastic deflection of the substrate 28, the stress placed on the substrate 28 is sufficient to eliminate most warpage, etc., in the region of the substrate 28 directly beneath the print drum 24.

The substrate 28 may be secured, and or transported through the printer, by various suitable means. One exemplary means may include clips or tabs that secure the substrate 28 about either end, or along the sides. Additionally, the substrate may be controlled using a series of idle and/or driven rollers. Alternatively, the substrate may include a header portion and a footer portion that may be secured. According to this last, the header and footer may include a separate member adhered to the substrate, or may include a peripheral portion of the substrate.

Figure 3A:
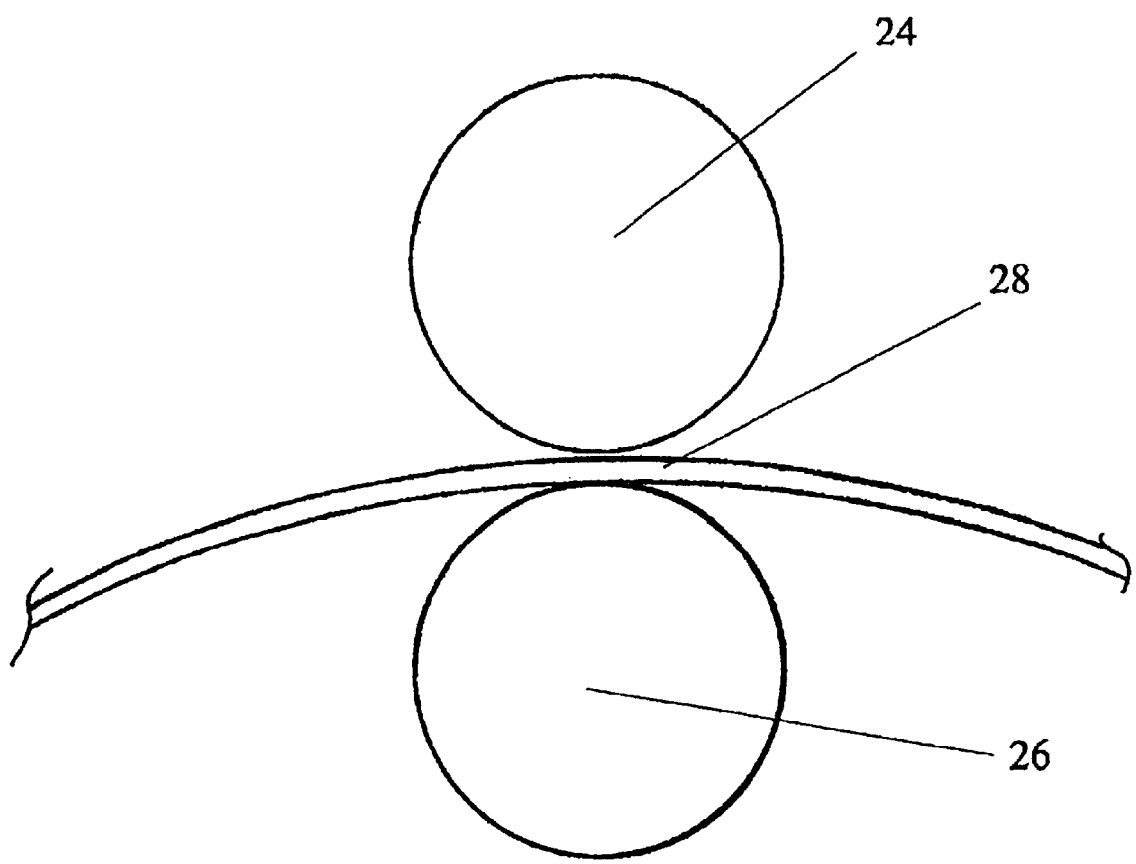
FIG. 3a is an enlarged drawing of a portion of the substrate feed system shown in FIG. 2.

It should be noted that FIGS. 2 and 3a present an illustrative representation of the system only. The relative dimensions of the support roller 26 and the print drum 24 may be varied according to specific process requirements. For example, the support roller 26 may be either larger or smaller than the print drum 24 depending upon the desired amount of curvature to be induced in the substrate 28, as well as the stiffness of the substrate 28. Similarly, the positioning of the support roller 26 relative to the print drum may be varied. For example, the support roller 26 may be disposed above or beneath the print drum 24 to provide a generally horizontal tangent-printing plane. Alternatively, the support roller 26 may be disposed to one side of the print drum 24 to provide a generally vertical tangent-printing plane. Various other configurations will also be appreciated.

In addition to flexing the substrate 28 along the feed direction, it may also be desirable to place the substrate 28 in tension in the feed direction. As illustrated in FIG. 2, tension may be applied to the substrate 28, for example, through the use of a spring 29, or similar tensioning device. Preferably the tension applied to the substrate 28 is controllable, therein allowing the tension, as well as the flexure stress, to be variable. In this manner, it may be possible to control and optimize the feed of the substrate 28 without having to materially alter the feed apparatus.

Figure 3B:
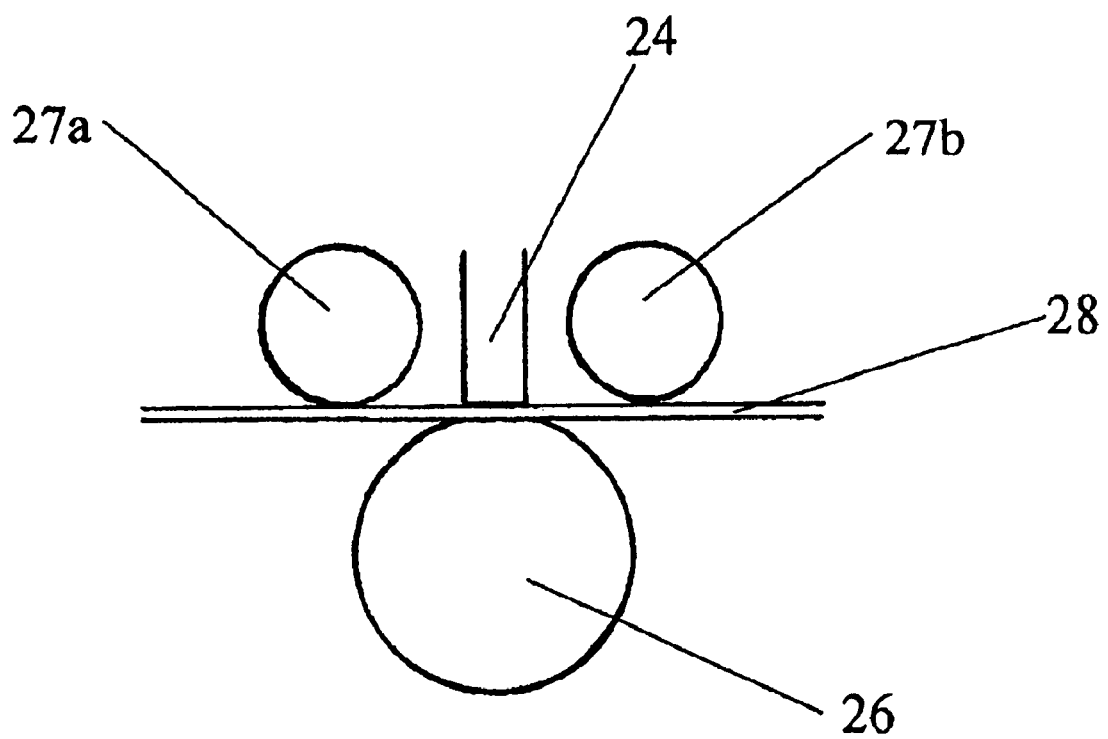

According to a similar configuration, illustrated in FIG. 3b, the substrate 28 may be disposed between support roller 26 and print head, or print drum 24 as in previous FIGS. 2 and 3a. In the system depicted in FIG. 3b, a force is applied to the substrate 28 by pressure rollers 27a and 27b, which are disposed adjacent to the print head 24. A three point bending force applied by pressure rollers 27a and 27b and support roller 26 may be utilized to remove any warpage of the substrate 28 in the region of the print head 24. Furthermore, by controlling the position of the pressure rollers 27a and 27b relative to the support roller 26, the substrate may be caused to flex around the support roller 26.

Consistent with the above described system/methods for applying bending and tension stress to the substrate, the distance between the first conductive layer of the substrate 28 and the print drum 24 may be varied by providing the support roller 26 with the capability of being moved relative to the print drum 24 in a direction that is normal to the drum surface where the metallic surface on the substrate, i.e., the conductive layer, makes closest approach to the print drum 24. The moveable facility of the support roller 26 relative to the print drum 24 allows the feed system shown in FIGS. 2 through 3b to be used with substrates 28 of different thicknesses. The feed system as described may even be adapted to provide feed for relatively thin and flexible substrates 28.

A similar system, not illustrated, may include flexing the substrate, as by coordinated rollers, into an arcuate configuration. As opposed to the above described systems, rather than disposing the print head, or print drum to apply a pattern mask to a convex surface of the arcuate substrate, the print head may be disposed to apply a pattern mask to a concave surface of the flexed substrate.

Figure 4:
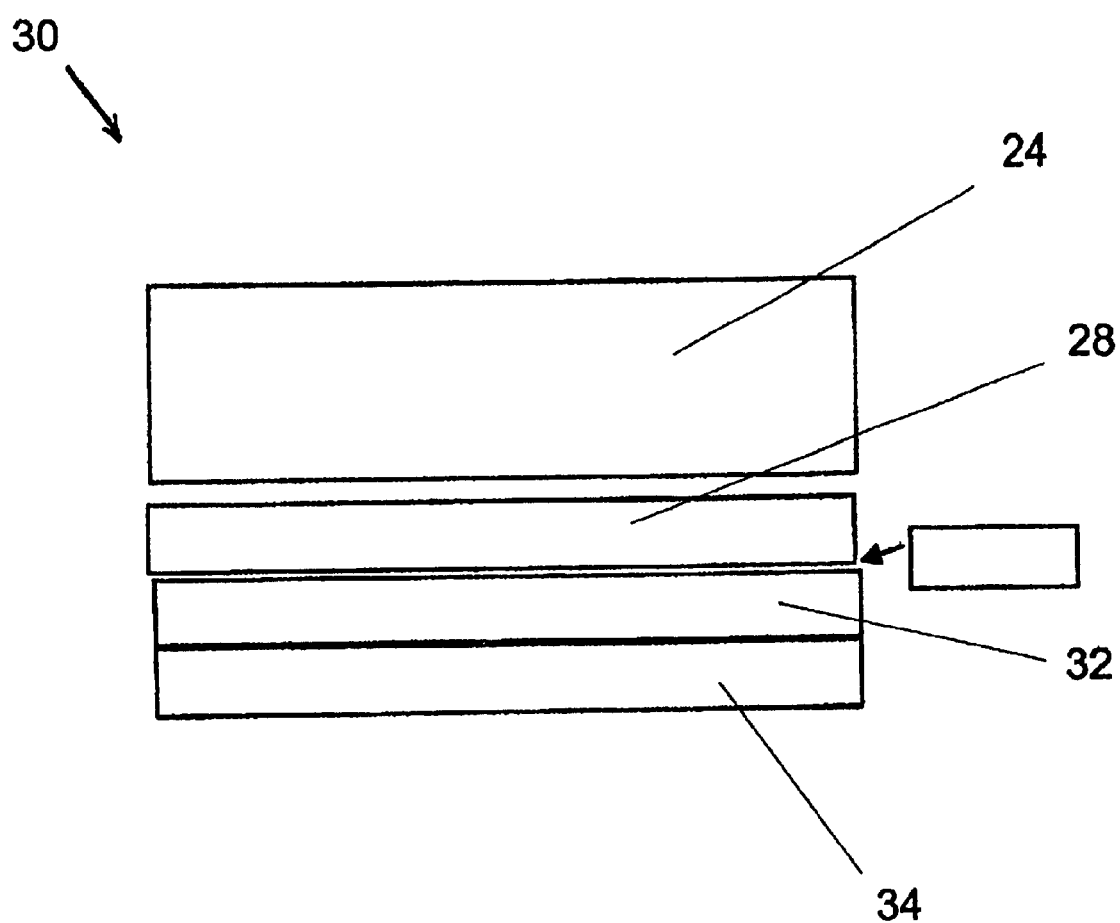
FIG. 4 is a cross-sectional view of a second exemplary substrate feed system consistent with the present invention.

Consistent with an alternative system, illustrated in FIG. 4, a rigid substrate 28 may be direct toner imaged using a flat platen arrangement 30. According to this system, the substrate 28 rides on a compliant member 32, which in turn is disposed on a rigid platen, or traveling bed, 34. The rigid platen 34 nullifies any flexure of the platen and substrate 28 along the direction of feed. The compliant member 32 supports the substrate 28 as it passes by, and is imaged by the print drum 24. However, the compliant character of the compliant member 32 allows relatively free movement of the substrate 28 in a direction that is generally normal to the drum surface where the substrate 28 makes closest approach to the print drum 24. In this manner, the maximum normal force that the substrate 28 may apply to the print drum 24 may be controlled by selecting the compliant member 32 having a predetermined resistance to deformation or deflection. By selecting a compliant member 32 having a resistance to deformation that will allow displacement of the substrate away from the print drum 24 at a force less than a force that may damage the print drum 24, the likelihood of such damage may be reduced or eliminated. The relatively light pressure between drum and substrate flattens the substrate and makes up for sag and thickness variation in the support.

Numerous materials and structural configurations are available for producing a compliant member 32 that will give the desired characteristics. According to a first embodiment, the compliant member 32 may include a sheet or pad of an elastomeric material. Alternatively, the compliant member 32 may be an elastomeric member having cut-outs on at least one side, thereby enhancing the deflection or compliance of the structure. Additionally, the compliant member may be a cellular or foam material, such as a flexible expanded polymeric foam. Still alternatively, the compliant member may be in the form of a flexible container filled with a gaseous or liquid material.

Obviously, the system described above with reference to FIG. 4 will require that the substrate 28 be generally retained to the compliant member 32. If the substrate 28 is present without holes, or with a limited number of holes, the substrate may be retained in position during direct toner imaging by a leaky gasket vacuum system. Alternatively, the substrate 28 may be held in position on the compliant member 32 using clips or pins. According to yet another alternative method of retaining the substrate 28 in position during processing, a temporary adhesive may be disposed between the substrate and the compliant member, thereby retaining the former to the latter. Suitable adhesives may include, for example, pressure sensitive adhesive, double sided tape, soluble adhesives, etc. Various other methods of maintaining the substrate 28 in position on the compliant member, while still allowing displacement of the substrate 28 in a direction generally orthogonal to the print drum 24, will be readily apparent to those having skill in the art.

Similar to the feed system discussed with reference to FIGS. 2 and 3a, the flat platen feed system illustrated in FIG. 4 is susceptible to modifications depending upon the process requirements. As discussed above, the compliance of the compliant member 32 may be varied to control maximum contact pressure between the print drum 24 and the substrate. The optimum compliance is, at least in part, dependent upon the rigidity of the substrate 28, with a more easily deformable compliant member 32 being suitable for more rigid substrates 28 with a greater degree of warpage, in order to prevent damage to the print drum 24. Additionally, the orientation of the flat platen feed system 30 relative to the print drum may be varied depending upon the desired tangent-printing plane.

Both of the feed systems described above for use with direct toner imaging of a rigid substrate may also be suitable for use with printing methods operating in off-set mode. When the pattern mask is to be applied using off-set printing techniques, the feed systems illustrated in FIGS. 2 through 4 may be employed generally as described, however, instead of being applied directly by the print drum 24 the pattern mask will be applied by an off-set toner transfer drum or belt. The offset toner transfer drum or belt may be situated, and may operate in a manner generally corresponding to the print drum 24 shown in the figures.

In addition to the above-described systems for passing the substrate through a printer, the substrate may be held stationary, and the printing apparatus may be caused to move across the substrate. Such an arrangement may be achieved by incorporating a servo transport mechanism into the printing apparatus. Accordingly, the printer may be capable of translating relative to the substrate in a highly controlled manner.

Due to unevenness in the substrate, poor affinity of the toner for the conductive layer, etc., a single printing pass may not be sufficient to provide the pattern mask with sufficient print density. In order to provide the pattern mask having a sufficient thickness, or print density, it may be necessary to print the pattern mask a number of times. Multi-pass printing may be accomplished by passing the substrate through a first laser printer again, or by passing the substrate through a series of printers, thereby achieving the same result. While specific feed systems have been discussed herein directed at limiting the effects substrate unevenness on print quality, the situation may occur where the problems arising from substrate unevenness are not fully overcome during the first printing pass.

In the specific case of a relatively rigid substrate, print density may be inconsistent as a result of any unevenness of the substrate. Any such unevenness may have to be accommodated to achieve the desired level of print density. As applied to the system illustrated in FIG. 3a, wherein unevenness of the substrate 28 is overcome by forcing the substrate 28 into an arcuate configuration, inconsistent print density may be overcome by making subsequent printing passes and adjusting the tension of the substrate 28 along the axis of the feed direction and/or adjusting the degree of curvature of the substrate 28 as it passes the print drum 24. By these techniques, the distance between the substrate 28 and the print drum 24 may be adjusted to optimize the print density of the toner applied to the substrate 28.

In the print feed system discussed with reference to FIG. 4, wherein a flat platen including a compliant member 32 is used to carry the substrate 28 during the toner application, poor print density may be overcome by placing shims under the substrate and making subsequent printing passes. The shims, when placed under low areas of the panel, may serve to raise such low areas, thereby bringing these low areas of the substrate to a more desirably distance from the print drum 24. In this manner poor print density due to excessive separation between the substrate 28 and the print drum 24 may be overcome.

When a relatively flexible substrate is employed with the present system, the above-described problems of unevenness, or lack of flatness, are generally not present, or at least not as pronounced. Therefore, it may not be necessary to make significant modifications to the feed system of the printer. However, while generally typical "pinch-roll" feed mechanisms may be sufficient, it may still be necessary to modify the feed mechanism to accommodate a substrate that is thicker than stock for which the feed mechanism is designed. Such modifications may be limited to simply increasing the gap between the conventional printer feed rolls to accommodate a substrate of the desired thickness.

Regardless of whether a single printer, or a series of printers are used to build up the necessary print density, and regardless of any techniques that may be employed to overcome lingering problems resulting from unevenness of the substrate, it is essential that any subsequent re-printing, or over-printing, of the first pattern mask be aligned with the toner pattern laid down during the first printing pass of the first pattern mask within the overall tolerances of the pattern mask. Therefore, the substrate should be aligned with the print head (print drum), and the feed of the substrate should be synchronized with the print drum.

In order to ensure proper alignment of the substrate relative to the print-head, and to properly synchronize the feed of the substrate, the printer utilized to make subsequent printing passes of the first pattern mask may be modified to include, or used in conjunction with separate hardware and/or firmware such as an optical detector or the like that is capable of detecting the presence and position of a previously printed pattern mask or indexing markings, such as discussed above. The hardware/firmware in conjunction with the indexing markings, previously printed on the substrate may be used to synchronize the feed of the substrate with the printing operation. Additionally, when used in conjunction with appropriate error correction software, the detected indexing markings may be used to compensate for positional errors. The alignment of multi-pass printed pattern masks may, therefore, be improved by shifting or adjusting the pattern mask applied during each of any subsequent printing passes relative to the detected indexing markings.

This aspect of the invention may also be taken to an even higher level. The printer utilized to apply subsequent pattern masks, or to reprint a previously applied pattern mask, may be used in conjunction with an optical scanning system. With such a system, a previously applied pattern mask may be optically scanned, and the detected previously applied pattern mask may be used not only to synchronize the printing process, but also to control placement of the subsequently applied pattern mask on the substrate. An optical scanner may be employed to detect the position and pattern of the previously applied pattern mask. The data collected from the optical scanner may be used to synchronize the subsequent printing process. Additionally, the data collected may be used to ensure that a subsequently applied pattern mask precisely follows the previously applied pattern mask. In this manner, even if the previously applied pattern mask is imperfectly oriented or positioned on the substrate, the subsequently applied pattern mask will be positioned and oriented in register with the previously applied pattern mask.

As an alternative to detecting index markings printed on to a surface of the substrate, orientation and positioning of pattern masks on the substrate and/or relative to previously applied pattern masks may be achieved using through holes, or similar features, included in the substrate. Through holes, or similar features, may be detected in a similar manner as an applied index marking, e.g., optically, and employed to the same ends as an applied index marking. However, a feature such as a through hole, provides a permanent reference on the substrate, and may, therefore, also be used in subsequent operations such as assembly of multiple printed circuits into a multi-layer circuit board.

After the first pattern mask has been applied to the substrate, the first pattern mask is set or cured. It is important that care is used in handling the printed substrate before and during the curing process. Unset toner has little adhesion to itself or to the surface of the printed substrate. Therefore, the printed pattern mask is susceptible to damage, such as by smudging or transfer to any contacting surfaces. The curing process for the pattern mask fuses the toner to the substrate, thereby increasing the bond strength between the first pattern mask and the first conductive layer. Additionally, the process of setting or curing the first pattern mask may enhance the mechanical properties of the first pattern mask, thereby reducing susceptibility to damage. However, careful process control is required in curing the toner. Improperly set toner may have poor adhesion to the substrate. Furthermore, over-cured toner may exhibit degenerated masking capabilities that may result in at least partial failure of the etch resist character of the pattern mask.

The first pattern mask may be set or cured thermally, for example, by baking or heat-treating the substrate including the first pattern mask in an oven. In the context of the exemplary etch resist toner, the first pattern mask may be set by heating the substrate, having the first pattern mask thereon, in an oven at a temperature of approximately 160° C. for a curing cycle of between approximately five minutes. In an alternative embodiment, the substrate having the first pattern mask thereon may be pre-heated to a moderate temperature of approximately 120° C. The temperature of the pre-heated substrate may then be increased over a period of about one minute to a higher temperature thereafter maintained for approximately five minutes. However, it should be appreciated that the exact temperature and time of the setting/curing cycle is dependent upon the toner employed to print the first pattern mask, and will therefore vary accordingly.

The curing cycle for the pattern mask is an especially critical process. If the pattern mask is over-cured or under-cured the pattern mask may exhibit poor stability on the substrate, e.g., poor adhesion to the substrate, poor masking properties, etc. The criticality of controlling the curing process is further compounded by the fact that a first applied and cured pattern mask may, effectively, experience two curing cycles. That is, the first pattern mask may experience a curing cycle when the first pattern mask is set, and then may also experience at least another partial curing cycle when a second pattern mask is cured.

When properly set (cured) the toner takes on a particular sheen, making it easy to determine if the toner has been properly cured. Therefore, an inspection station may advantageously be placed in a manufacturing line upstream of the curing station to inspect cured pattern mask. The inspection station may comprise, for example, an optical scanner wherein the reflective properties of the cured pattern mask may be evaluated. Accordingly, any substrates containing a pattern mask that is determined to be improperly cured may be removed from the manufacturing line without completing the manufacturing process. Depending upon the state of the curing defect, i.e., under cured or over cured, the defect may be remedied and the substrate now including a properly cured pattern mask may be reintroduced into the manufacturing line to undergo the remaining manufacturing processes.

Alternatively, the first pattern mask may be set or cured photo-metrically, by exposure to light of a predetermined wavelength. For example, the setting or curing process may include exposure to visible light, to IR, or UV radiation of an appropriate intensity for a predetermined duration. Further, it should be appreciated that additional methods of setting or curing the first pattern mask may be employed depending upon the exact make-up of the etch resist toner.

Figure 5:
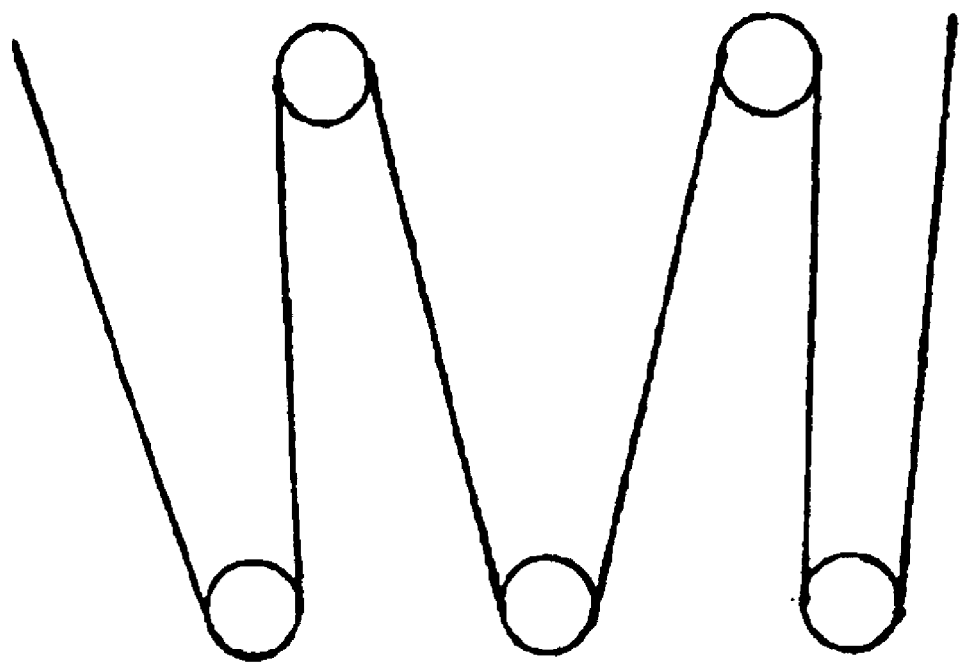
FIG. 5 is a schematic view of an exemplary serpentine feed system as may be applicable for used during the curing process consistent with the present invention.

In the context of a continuous manufacturing process, the controlling process with regard to line speed is generally the speed of the curing and mask removal processes. The printing process is generally the least adjustable, with respect to speed, but the output from a multiplicity of printers could be accumulated and joined, and thereafter undergo the remaining manufacturing processes. Therefore, the dwell time in the oven or cure station and the removal station is relatively large. The floor space, or footprint, of the oven, or cure station, may be reduced by establishing a serpentine path in the oven, such as that shown in FIG. 5. In this manner, a relatively long linear travel path may be established within the oven, while requiring a relatively small footprint or line footage. Numerous alternatives exist by which the same effect may be achieved, for example, a system of horizontal and/or vertical elevators within the oven, slowly rotating turntables within the oven, etc. In these manufacturing processes beyond imaging and setting care must be taken to protect the first imaged side from being damaged by appropriate roller radiuses and protective shields.

Optionally, the substrate including the first pattern mask may be post processed to refine the toner image. It may sometimes be the case that the pattern mask may have poorly defined edges, i.e., rough or ragged edges under magnification. After the toner pattern mask has been partially, or fully cured the edges of the pattern mask may be smoothed by exposure to a mild solvent. The mild solvent acts to coalesce any small features into the main pattern of the toner mask. Exemplary solvents may include NMP (N-methyl pyrrolidone) and But OxEtAc (butoxyethyl acetate). Similar solvents, such as cymene, xylene, and toluene, may also be employed to achieve the same result. Consistent with this process step, the solvents employed are preferably present in a very dilute state, as it is only desired to coalesce any fringe into the body of the printed pattern. An excessively strong solvent may damage the actual printed pattern.

With the first pattern mask set (cured) on the first conductive layer, a second pattern mask may be applied to a portion of the second conductive layer, leaving portions of the second conductive layer exposed. The second pattern mask is applied to the second conductive layer corresponding to a second desired conductive pathway, or plurality of desired conductive pathways. The second pattern mask may be of the same pattern as the first pattern mask, or may alternatively be of a different distinct pattern. Desirably, the second pattern mask is applied by directly printing the second pattern mask to the second conductive layer. Similar to the method by which the first pattern mask was applied, the second pattern mask is preferably applied by printing techniques including ink jet printing or laser printing, wherein each of these techniques may also be employed by printing in off-set mode.

In order to apply the second pattern mask, the substrate may be turned over, as illustrated in the schematic drawing of FIG. 1, by passing around a turning drum or roller 7, for example. In the case where the substrate is turned over, the second printer 8 may be disposed above the substrate. However, the second pattern mask may also be applied without turning the substrate over by disposing the second printer on the other side of the substrate. This second method may advantageously be employed in the case of a flexible substrate, being fed through the second printer via a nip roll feed system, or in the case of a relatively rigid substrate when the substrate is caused to flex against a support roll, as described with reference to FIGS. 2 and 3a. According to the latter method, the second printer may be disposed on the other side of the substrate, i.e., adjacent to the second conductive layer, wherein the substrate is stressed into a convex configuration relative to the second conductive layer. According to the latter method, the second printer may be disposed on the other side of the substrate, i.e., adjacent to the second conductive layer.

The laser printing apparatus 8 used to apply the second pattern mask may be of the same general variety as the laser printer employed to apply the first pattern mask. In some instances, the laser printed employed to apply the first pattern mask may even be used to apply the second pattern mask, wherein the substrate is re-fed through the first laser printer with the second conductive layer being oriented adjacent to the print head.

Obviously, the modifications and alterations associated with the first laser printer are equally applicable to the second laser printer. For example, the laser printer used to apply the second pattern mask may be modified to accommodate the thickness and rigidity of the substrate. Additionally, as with the laser printer used to apply the first pattern mask, the laser printer used to apply the second pattern mask may include distortion correction software to compensate for any fixed errors of the laser printer. Furthermore, the feed mechanisms, etc. associated with the second laser printer may be generally analogous to those employed with relation to the first laser printer.

As discussed with respect to the first pattern mask, it may be necessary to conduct more than one printing pass to achieved the desired print density, or mask thickness of the second pattern mask. Similar to the methods employed for printing the first pattern mask, in the event that the print density of the second pattern mask is insufficient, the substrate may be re-printed as necessary. Accordingly, it may be desirably to include index markings, or similar features, associated with the second pattern mask. The index markings used to register multiple re-printings of the second pattern mask may advantageously be the index markings applied with reference to the first pattern mask. In either instance, the detection apparatus, e.g., an optical scanner, should be positioned appropriately to detect the index markings. Utilizing the index markings, subsequent printing processes may be synchronized with the feed of the substrate, and the subsequently laid down toner masks may be aligned with the second pattern mask as originally applied.

Furthermore, as discussed with reference to the application of the first pattern mask, any shortcomings with respect to the print density may be the result of unevenness of the substrate that was not fully accommodated during the first printing pass of the second pattern layer. As with the printing of the first pattern mask, during subsequent printing, or re-printing operations carried out for the second pattern mask measures may be taken to further accommodate any unevenness of the substrate. Similar to the printing of the first pattern mask, unevenness in relatively rigid substrates may be accommodated through the use of shims disposed between the substrate and the compliant member on the platen, or by adjusting the tension and degree of curvature of the substrate, depending upon the method of feeding the substrate during the printing operation.

It may be desirable to include vias, or other features extending through the final printed circuit. In the interest of accurately connecting conductive patterns on opposed sides of the substrate and/or of not disrupting conductive patterns on either side of the substrate, the first pattern mask and the second pattern mask will desirably be accurately placed and oriented with respect to one another. The placement and orientation of the individual pattern masks may be carried out in a variety of ways. According to a first exemplary method, index markings are printed on the substrate prior to or during printing either the first or the second pattern mask. The subsequent printing of both of the first and the second pattern mask may then be printed in a determined relationship to the index markings.

According to a second alternative method consistent with the present invention, the second pattern mask may be oriented and positioned relative to the first pattern mask by optically scanning the first pattern mask. Consistent with this aspect, the first pattern mask may be optically scanned, the output of the optic scan being input to error correction software. The error correction software may then adjust the printing of the second pattern mask to be appropriately positioned and oriented relative to the first pattern mask. In this manner the orientation and position of the second pattern mask may be adjusted corresponding to any deviations in orientation and/or position of the first pattern mask. Therefore, the second pattern mask may be applied to the second conductive layer in accurate register to the first pattern mask.

Similar to the process discussed above with reference to the first pattern mask, subsequent to being applied the second pattern mask is set or cured. While the same general techniques may be employed for setting the second pattern mask, i.e., baking, infrared exposure, ultraviolet exposure, etc., if a different toner or ink is used to form the second pattern mask, the exact curing techniques and/or parameters may vary accordingly.

After both the first pattern mask and the second pattern mask have been applied to the respective conductive layers and have been set or cured, the substrate may be etched to remove the exposed regions of the first conductive layer and the second conductive layer. The exposed regions of the first and second conductive layer may be removed using conventionally known etching solutions and techniques, the exact nature of which are dependent upon the nature of the metals of the conductive layers. The respective exposed regions of the first conductive layer and the second conductive layer may be etched either simultaneously or sequentially. The first and second conductive layers may be simultaneously etched by, for example, passing the substrate through a bath of etching solution, whereby both the first and the second conductive layers may be exposed to the etching solution at the same time. Alternatively, the etching solution may be selectively applied to the first and the second conductive layers individually, thereby sequentially etching the individual conductive layers.

Once the conductive layers on the substrate has been etched, thereby reducing each of the first and the second conductive layers to a desired pattern, the first and the second pattern mask may be removed from the substrate. The pattern masks may be removed from the respective sides of the substrate using chemical and/or mechanical mask removal techniques. Exemplary chemical mask removal techniques may include dissolving each pattern mask in an appropriate solvent and/or weakening or breaking the adhesion between the pattern masks and the conductive layer to which each pattern mask has been applied. This process may be accelerated by providing the solvent in a heated condition. As an alternative to, or in addition to chemical mask removal techniques, the pattern mask may be removed by mechanical scrubbing and/or abrasive removal of the pattern masks. For example, a mechanical scrubbing action may be applied to a pattern mask to physically break the bond between the pattern mask and the underlying conductive layer. Alternatively, the pattern mask may be abraded, lapped, or ground down until the underlying conductive layer is completely exposed. Such abrasive removal techniques should be carefully controlled when applied to very thin conductive layers to minimize damage to the conductive layer. Still alternatively, a combination of chemical and mechanical removal techniques may be advantageously employed to remove the pattern mask.

The process consistent with the present invention may conclude with a final scrubbing or cleaning process. Consistent with this final process, any remnants of a pattern mask, contaminants, etc, may be removed from the substrate. Additionally, the scrubbing or cleaning process may be employed to prepare the printed circuit board for additional processing, such as further etching, soldering, plating, the application of electronic components, etc. Exemplary scrubbing or cleaning processes may include either abrasive or non-abrasive scrubbing. Alternatively, or additionally, this final process may involve the use of solvents or cleaning agents.

Figure 6:
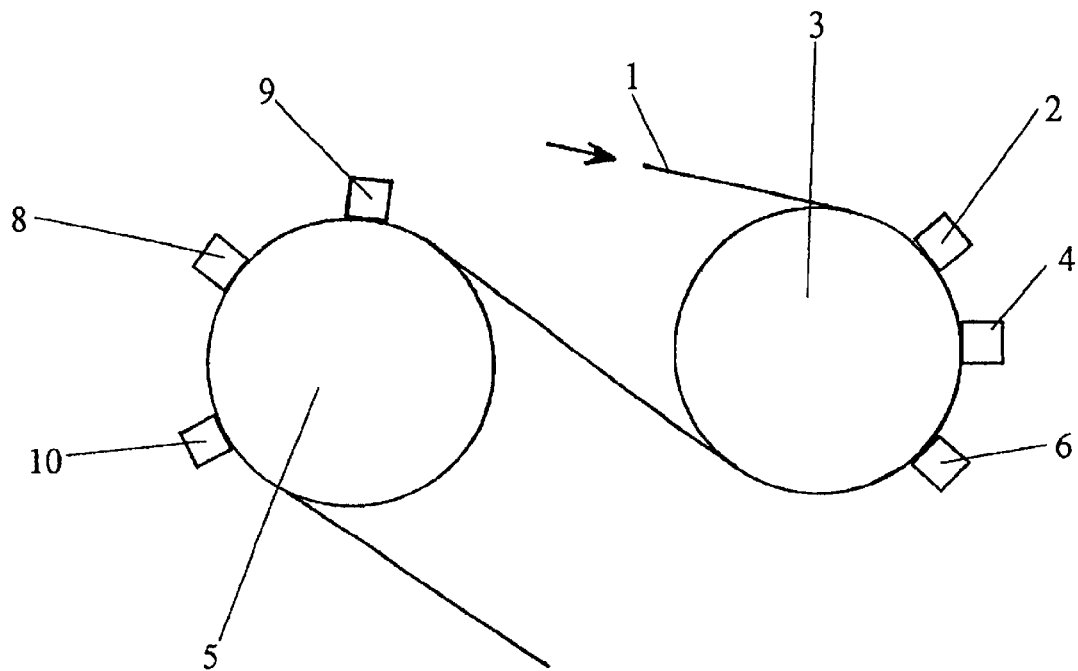
FIG. 6 is a schematic view of an exemplary system for producing a printed circuit consistent with the present invention.

Referring to FIG. 6, a schematic illustration of an exemplary system for use with the above-described method for producing a printed circuit consistent with the present invention is illustrated. With reference numerals for the various processes consistent with the schematic drawing of FIG. 1, a substrate web 1 travels in a serpentine manner over two support rolls 3 and 5, traveling in a direction indicated by the arrow. The substrate web 1 may be a flexible substrate, a single relatively rigid substrate, or a plurality of connected individual substrates. In the case of a single rigid substrate or a plurality of connected individual substrates, a plurality of idler or driven rollers may advantageously be employed to flex the substrate into conformance with the support rolls 3 and 5. While a system consistent with FIG. 6 used in conjunction with a flexible substrate may also employ idler or driven rolls to control the web 1, the web may also be controlled by adjusting the tension on the web 1 as it passes around the support rolls 3 and 5.

As the web 1 passes around the support rolls 3 and 5 it undergoes the various processes consistent with the invention herein. Accordingly, as the web 1 passes over the first support roll 3, the first conductive layer of the substrate may be sequentially cleaned 2, then have a pattern mask applied to the surface thereof 4, and finally the pattern mask may be set 6. In a similar manner, as the web 1 passes around the second support roll 5, the second conductive layer may be cleaned 9, and then have a second pattern mask applied to the second conductive layer 8. Finally, the second pattern mask may be set 10 on the second conductive layer. The further processing steps of etching, removing the pattern masks, etc. may also take place while the web 1 passes around the support rolls, or may take place at a later point in the processing line.

It should be appreciated that additional processes, not illustrated, may take place as the web passes around the support rolls 3 and 5. For example, after the first pattern mask is printed, the pattern mask may be analyzed for print density, and subsequently re-printed as necessary. Additionally, the printed pattern mask may be treated with a dilute mild solvent to coalesce any fringe of the pattern into the body of the printed pattern mask. Similar additional processes may be executed on the second support roll 5, with respect to the second pattern mask.

According to an alternative embodiment, a printed circuit may be produced using the general process as laid out above with reference to the application of an etch resist mask and subsequent curing of the etch resist mask and etching of the conductive layer of the substrate. The present alternative embodiment employs the use of a non-conductive substrate, as above, differing in that the conductive layer is very thin. A plating resist pattern mask is applied to the conductive layer of the substrate by directly applying a resist toner or ink to the conductive layer using a laser printer or inkjet printer. Furthermore, the plating resist mask may also be applied using a laser printer or an inkjet printer operating in offset mode. The plating resist mask is applied in a pattern that is the negative of the desired pattern of conductive pathways. That is, the plating resist pattern mask is applied to those regions of the conductive layer of the substrate in which it is desired to not have a conductive pathway. Thereafter, the plating resist mask may be cured in a manner consistent with the curing processes described above with reference to the curing of the etch resist mask.

After the plating resist mask has been applied, the printed circuit may be plated, as by such known techniques as electro-plating and electroless plating, whereby a conductive material is deposited in those regions not covered by the plating resist mask. Subsequently, the plating resist mask may be removed, as by chemical and/or mechanical removal processes.

The printed circuit may then be etched, only to the degree necessary to remove the thin conductive layer that was protected by the plating resist mask during the plating process. While the plated conductive pathways, i.e., the regions that received conductive material during the plating process, may be reduced in cross-section, proper design of the plating resist mask will leave these conductive pathways having the necessary thickness and width.

Consistent with another alternative embodiment of the present invention, a printed circuit manufacturing process is provided wherein a desired pattern of conductive pathways may be formed directly on a non-conducting substrate by printing using a conductive toner or ink. Desirably, the conductive toner may include a catalyst suitable for electroless plating, whereby the conductivity of the printed patterns may be enhanced. The catalyst included in the conductive toner or ink aids in ensuring that the plating will take place primarily on the imaged pattern areas. Generally, the process for direct toner application of conductive pathways follows the scheme as set forth above with respect to direct toner application of etch resist masks. However, some modifications to the general manufacturing process should be made.

A first modification that may be made to the manufacturing process, when tailored for the direct application of conductive pathways relates to the cleaning process. While the general process of pre-cleaning the un-coated butter board, i.e., the non-conductive substrate not including conductive layers, may be advantageous, as the substrate does not contain conductive layers this process may be limited to merely cleaning the surface of the substrate of contaminants.

Obviously, another modification to the process is that toner of a electrically conductive nature, rather than of a chemical etch resist nature, is applied to the substrate. Even without problems of unevenness of the substrate or poor print density it may be desirably to make multiple printing passes. Through the course of the several printing passes the conductive toner trace may be built up, whereby it is possible to achieve a low electrical resistance in the directly printed conductive pathway(s).

Furthermore, while toners suitable for use with the first embodiment of the present invention, i.e., direct toner printing of an etch resist pattern mask, may be at least somewhat conductive, e.g., the exemplary Hewlett Packard toner, it may be necessary to select toners having a greater level of conductivity and/or dope the toners with conductive agents such as organo-metallic particles, as well as a catalyst. However, in selecting more conductive toners or modifying existing toners to be more conductive, care must be taken to employ conductive materials and catalysts that do not interfere with the printing process.

Even with the direct application of conductive toner to a non-conductive substrate it is desirable to provide an electrical voltage between the print drum, or offset roller or belt. However, because the substrate on which the conductive toner is being applied does not include a conductive layer, a removable conductive backing foil may be applied to the substrate during the printing process. The removable backing foil may be applied using an adhesive, mechanical fasteners, etc. Alternatively, in the case of a flat platen feed system, the removable backing foil may be disposed between the compliant member and the substrate. Still alternatively, the compliant member itself may be conductive, or provided with a conductive treatment such as a conductive foil layer. According to this embodiment, the removable backing foil or conductive compliant member may be coupled to an electrical voltage to enhance toner transfer to the substrate.

Still alternatively, in a system where the substrate is flexed around a support roll, as shown in FIGS. 2 and 3a, or when nip rolls are use to feed the substrate, a conductive roll disposed beneath the print drum and in contact with the substrate may be coupled to an electrical voltage to enhance the transfer of toner from the print drum to the substrate.

According to any of the above embodiments for providing an electrical voltage, it should be appreciated that a higher voltage may be required than is required in the case of direct toner deposition of a pattern mask to a conductive layer. This is because a non-conductive member, i.e., the substrate not including a conductive layer, is interposed between the print drum and the second conductive member coupled to the electrical voltage. Accordingly, the magnitude of the electrical voltage is not only related to the conductivity of the toner, and to the gap between the print drum and the substrate, but also to the thickness of the non-conductive substrate.

As mentioned with respect to the curing process of the first and the second etch resist pattern layer above, the curing process, specifically the temperature and time for curing the toner, is dependent upon the specific toner or ink employed to form the pattern layer. It should be appreciated that in the process consistent with this embodiment of the invention the same principles apply. Therefore, the exact curing cycle utilized with respect to the direct application of conductive toner or ink will similarly vary depending upon the exact nature of the toner employed to form the conductive pathways.

Obviously, because the substrate does not contain a conductive layer that must be etched to produce the desired pattern of conductive pathways, there is no need to perform an etching step. Similarly, because the directly applied toner or ink itself makes up the conductive pathways of the printed circuit board, the process will not include a step of removing the toner mask from the substrate. Furthermore, it may be desirable to eliminate the final cleaning process, or at least diminish the intensity, in order to prevent damage to the directly applied toner or ink conductive pathways. These conductive pathways may need to be built up for conductivity or strength reasons. The required build up may be achieved by, e.g., electroless plating, direct metallization, etc., which will plate primarily on the conductive toner or ink pattern because of the catalyst included therewith.

The printed circuit manufacturing process relating to the direct printing of a desired pattern of conductive pathways on to a non-conducting substrate may also advantageously be carried out in a continuous manner, as described previously with reference to printed circuit manufacturing employing direct printing of an etch resist pattern mask to a conductive layer of a printed circuit substrate. Of course, the continuous manufacturing process will be modified in accordance with the considerations discussed above.

The printed circuit boards manufactured according to the present invention are suitable for additional processing as in known in the art. Specifically, the process according to the present invention is susceptible to additional direct printing of circuit devices, insulators, and vias as described in International Application Number PCT/US00/02543 filed Feb. 1, 2000, the entire disclosure of which is incorporated herein by reference.

Furthermore, the double sided nature of printed circuit boards achievable with the process consistent with the present invention may be suitable for the production of multi-layer laminated circuit boards, wherein numerous printed circuit boards may be laminated into a composite structure including interleaved printed circuit boards separated by insulating layers. The individual, but isolated printed circuit boards included in such a laminated composite structure may be selectively electrically coupled one to another by way of plated vias and trough holes extending therebetween, etc.

It will be appreciated that the exemplary embodiments described and depicted the accompanying drawings herein are for illustrative purposes only, and should not be interpreted as limiting. It is obvious that many other embodiments, which will be readily apparent to those skilled in the art, may be made without departing materially from the spirit and scope of the invention as defined in the appended claims.

What is claimed is:

1. A process for forming a circuit board comprising:
   supplying a non-conductive substrate having a top surface with a conductive layer disposed thereon;
   cleaning a surface of the conductive layer;
   printing a first patterned etch resist mask directly onto at least a portion of the conductive layer, leaving at least an exposed portion of the conductive layer;
   setting the printed patterned etch resist mask;
   removing the exposed portion of the conductive layer;
   removing the patterned etch resist mask from the remainder of the conductive layer.

2. The process according to claim 1 wherein the patterned etch resist mask is printed directly onto the conductive layer using a laser printer.

3. The process according to claim 1 wherein the patterned etch resist mask is printed directly onto the conductive layer using a laser printer in an offset mode.

4. The process according to claim 2 wherein the patterned etch resist mask is printed using a dry toner.

5. The process according to claim 1 wherein the patterned etch resist mask is set by heating the etch resist mask.

6. The process according to claim 1 wherein the patterned etch resist mask is set by exposing the etch resist mask to infrared radiation and/or ultraviolet radiation.

7. The process according to claim 1 wherein the patterned etch resist mask is printed directly onto the conductive layer by electrostatic printing, lithographic printing, or intaglio printing.

8. The process according to claim 1 wherein the surface of the conductive layer is cleaned by chemical-machine-polishing with a mild abrasive.

9. The process according to claim 1 wherein the patterned etch resist mask is printed by supplying an electric potential between the conductive layer and a print head.

10. The process according to claim 9 wherein the electrical potential is in the range of between about 50–300 volts.

11. The process according to claim 1 wherein the patterned etch resist mask is directly printed onto the conductive layer using an inkjet printer.

12. The process according to claim 1 wherein the patterned etch resist mask is directly printed onto the conductive layer using an inkjet printer in an offset mode.

13. The process according to claim 1 wherein the substrate and the conductive layer are flexed over a support roller disposed adjacent to a print head of a printer, and the patterned etch resist mask is printed directly onto the conductive layer flexed into an arcuate configuration.

14. The process according to claim 1 wherein the substrate is retained on a compliant member which in turn is disposed on a rigid member, whereby the substrate may be displaced in a direction that is orthogonal to an axis of an axis of one of a print drum or a print head.

15. The process according to claim 14 wherein the substrate is retained on the compliant member a vacuum applied between the substrate and the compliant member.

16. The process according to claim 14 wherein the substrate is retained on the compliant member by means of locating pins.

17. The process according to claim 1 further comprising subjecting the printed patterned etch resist mask to a mild solvent after the etch resist mask has been at least partially set, whereby to sooth edges of the patterned etch resist mask.

18. The process according to claim 17 wherein the mild solvent is selected from the group consisting of N-methyl pyrrolidone, butoxyethyl acetate, cymene, xylene, toluene, and cellusolve.

19. The process according to claim 1 further comprising the steps of ascertaining errors in a printer used to print the patterned etch resist mask and compensating for the ascertained errors during printing of the patterned etch resist mask.

20. The process according to claim 1 further comprising directly printing a second patterned etch resist mask onto at least one of at least a portion of the conductive layer and the first patterned etch resist mask.

21. The process according to claim 20 wherein the second patterned etch resist mask is positioned based on at least one of at least a portion of the first patterned etch resist mask and an index marking applied to at least one of the substrate and the conductive layer.

22. The process according to claim 1 further comprising:
cleaning a surface of a second conductive layer disposed on a bottom surface of the non-conductive substrate;
directly printing a second patterned etch resist mask onto at least a portion of the second conductive layer leaving at least an exposed portion of the second conductive layer;
setting the second patterned etch resist mask;
removing the exposed portion of the second conductive layer; and
removing the second patterned etch resist mask from the second conductive layer.

* * * * *